(12) United States Patent
Kim

(10) Patent No.: US 9,043,511 B2
Kim
(45) Date of Patent: May 26, 2015

(54) SEMICONDUCTOR MEMORY DEVICE AND OPERATION METHOD THEREOF

(71) Applicant: SK hynix Inc., Gyeonggi-do (KR)

(72) Inventor: Tae-Kyun Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 6 days.

(21) Appl. No.: 13/660,719

(22) Filed: Oct. 25, 2012

(65) Prior Publication Data
US 2013/0111081 A1    May 2, 2013

(30) Foreign Application Priority Data
Oct. 27, 2011   (KR) .................. 10-2011-0110498

(51) Int. Cl.
G06F 3/00 (2006.01)
G06F 5/00 (2006.01)
G11C 11/4072 (2006.01)
G11C 7/10 (2006.01)

(52) U.S. Cl.
CPC .......... *G11C 11/4072* (2013.01); *G11C 7/1045* (2013.01)

(58) Field of Classification Search
CPC ........................ G06F 9/30087; G06F 9/3897
See application file for complete search history.

(56) References Cited

U.S. PATENT DOCUMENTS

| | | | |
|---|---|---|---|
| 6,944,737 B2* | 9/2005 | Ahn et al. ............... | 711/167 |
| 7,212,465 B2* | 5/2007 | Kang ...................... | 365/193 |
| 2003/0221048 A1* | 11/2003 | Roohparvar ............ | 711/103 |
| 2005/0144361 A1* | 6/2005 | Gonzalez et al. ...... | 711/103 |
| 2009/0013144 A1* | 1/2009 | Kitamura ................ | 711/168 |
| 2010/0118614 A1* | 5/2010 | You ..................... | 365/189.02 |
| 2012/0051149 A1* | 3/2012 | You ..................... | 365/189.02 |
| 2013/0111081 A1* | 5/2013 | Kim ..................... | 710/38 |

* cited by examiner

*Primary Examiner* — Elias Mamo
(74) *Attorney, Agent, or Firm* — IP & T Group LLP

(57) ABSTRACT

A semiconductor memory device includes a selection signal generation unit configured to generate a plurality of selection signals that are sequentially activated, a path selection unit configured to select a transmission path of sequentially input information data in response to the plurality of selection signals, a plurality of first storage units, each configured to have a first storage completion time and store an output signal of the path selection unit, and a plurality of second storage units, each configured to have a second storage completion time, which is longer than the first storage completion time, and store a respective output signal of the plurality of first storage units.

8 Claims, 5 Drawing Sheets

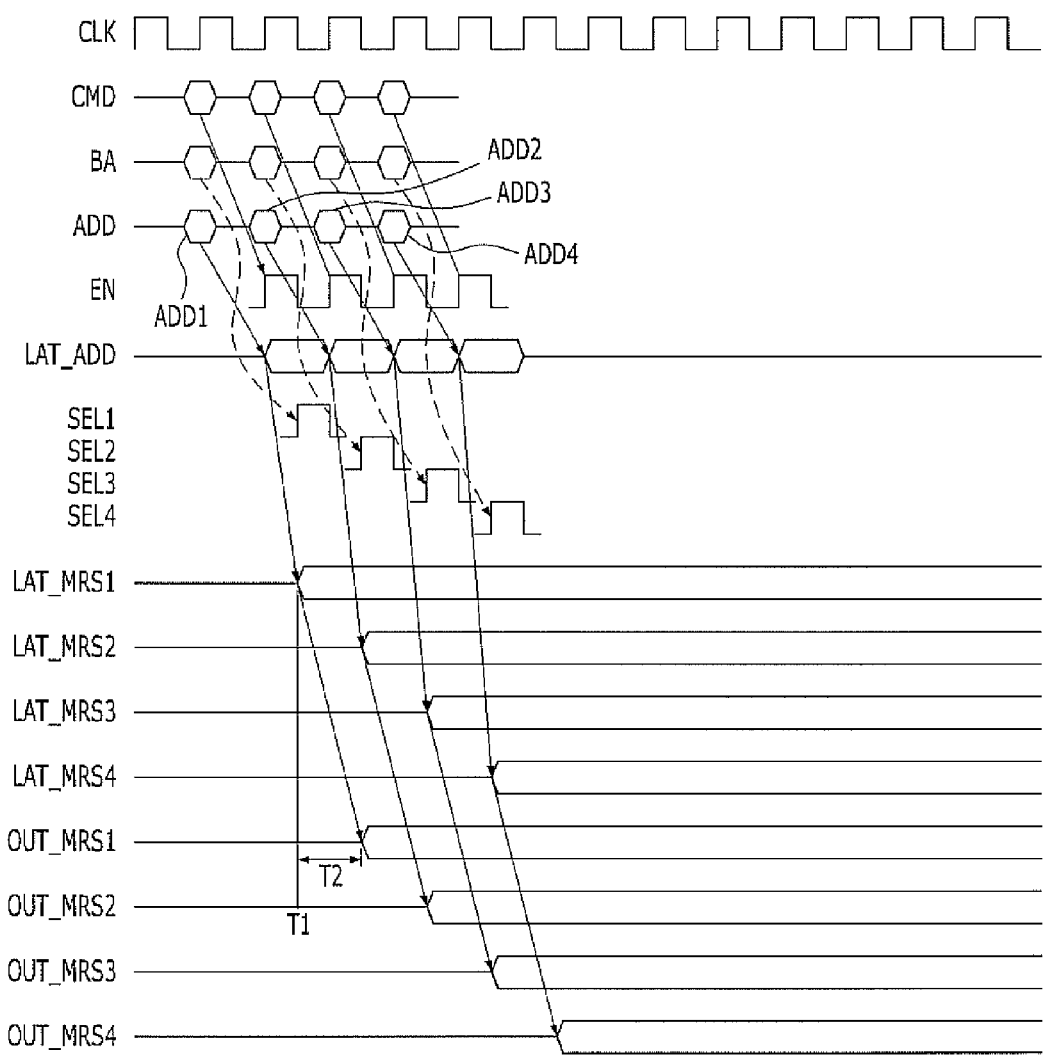

SEMICONDUCTOR MEMORY DEVICE AND OPERATION METHOD THEREOF

CROSS-REFERENCE TO RELATED APPLICATIONS

The present application claims priority of Korean Patent Application No. 10-2011-0110498, filed on Oct. 27, 2011, which is incorporated herein by reference in its entirety.

BACKGROUND

1. Field

Exemplary embodiments of the present invention relate to a semiconductor design technology, and more particularly, to a semiconductor memory device provided with mode register units.

2. Description of the Related Art

In general, a semiconductor memory device such as a double data rate synchronous DRAM (DDR SDRAM) is provided with mode register units, wherein the mode register units store information of device operation, such as CAS latency, column address strobe latency, a bust type, a burst length, a bank grouping mode, and DLL on/off. The mode register units store corresponding information before the semiconductor memory device operates, and the semiconductor memory device is set with the stored information. The information data stored in the mode register units is input through address pins, and will be referred to as address signals ADD for the purpose of convenience.

FIG. 1 is a block diagram for explaining a partial configuration of a conventional semiconductor memory device.

Referring to FIG. 1, the semiconductor memory device includes a command decoding unit 110, a mode register activation control unit 120, and first to fourth mode register units 130_1 to 130_4.

The command decoding unit 110 generates a mode register enable signal EN in response to a plurality of command signals CMD, and the mode register activation control unit 120 generates first to fourth mode register activation signals EN_MRS1 to EN_MRS4 corresponding to a plurality of bank address signals BA in response to the mode register enable signal EN. The mode register enable signal EN is activated when the command signals CMD is input to the command decoding unit 110 with a given value corresponding to a mode register units operation, and the bank address signals BA are used to select the first to fourth mode register units 130_1 to 130_4.

The first to fourth mode register units 130_1 to 130_4 store address signals ADD in response to the first to fourth mode register activation signals EN_MRS1 to EN_MRS4, respectively. Data stored in the first to fourth mode register units units 130_1 to 130_4 is used as the aforementioned information on CAS latency, a bust type, a burst length, a bank grouping mode, DLL on/off, and the like.

FIG. 2 is an operation waveform diagram for illustrating the operation of the semiconductor memory device of FIG. 1. Hereinafter, the operation of the semiconductor memory device will be described with reference to FIG. 1 and FIG. 2.

The command decoding unit 110 decodes the command signals CMD and activates the mode register enable signal EN. In general, the bank address signals BA and the address signals ADD are input at substantially the same time as that of the command signals CMD. The mode register activation control unit 120 activates a mode register activation signal corresponding to the bank address signals BA of the first to fourth mode register activation signals EN_MRS1 to EN_MRS4 in response to the bank address signals BA and the mode register enable signal EN. The first to fourth mode register units 130_1 to 130_4 receive and store the address signals ADD in response to the first to fourth mode register activation signals EN_MRS1 to EN_MRS4, and decode the stored data to output first to fourth mode register output signals OUT_MRS1 to OUT_MRS4, respectively.

Meanwhile, a predetermined time is required for the first to fourth mode register units 130_1 to 130_4 to receive and store the address signals ADD. In other words, the first mode register unit 130_1 receives a first address signal ADD1 (refer to FIG. 2) corresponding to the first mode register unit 130_1 in response to the first mode register activation signal EN_MRS1, and decodes the received first address signal ADD1 to output the first mode register output signal OUT_MRS1 after a predetermined time lapses. A second address signal ADD2 corresponding to the second mode register unit 130_2 should be input after the first mode register output signal OUT_MRS1 is output. This is applied to third and fourth address signals ADD3 and ADD4 in the same manner.

Accordingly, to stably store the address signals ADD in the first to fourth mode register units 130_1 to 130_4, it is necessary to input the first to fourth address signals ADD1 to ADD4 in consideration of data storage completion times of the first to fourth mode register units 130_1 to 130_4. This is because input times of the first to fourth address signals ADD1 to ADD4 are limited due to the storage completion times of the first to fourth mode register units 130_1 to 130_4.

Recently, a semiconductor memory device operates at a higher speed. However, obtaining a high speed operation of the semiconductor memory device may be hindered by data storage completion times of mode registers.

SUMMARY

Exemplary embodiments of the present invention are directed to a semiconductor memory device that enables data storage operations of mode registers regardless of data storage completion times of the mode registers.

In accordance with an exemplary embodiment of the present invention, a semiconductor memory device includes a selection signal generation unit configured to generate a plurality of selection signals that are sequentially activated, a path selection unit configured to select a transmission path of sequentially input information data in response to the plurality of selection signals, a plurality of first storage units, each configured to have a first storage completion time and store an output signal of the path selection unit, and a plurality of second storage units, each configured to have a second storage completion time, which is longer than the first storage completion time, and store a respective output signal of the plurality of first storage units.

In accordance with another exemplary embodiment of the present invention, a semiconductor memory device includes a command decoding unit configured to decode an external command signals and generate a mode register activation signal, a selection signal generation unit configured to generate a plurality of sequentially activated selection signals in response to the mode register activation signal and at least one bank address signal, a path selection unit configured to select a transmission path of sequentially input addresses in response to the selection signals, a plurality of storage units, each configured to have a first storage completion time and store an output signal of the path selection unit, and a plurality of mode register units, each configured to have a second storage completion time, which is longer than the first storage completion time, and store a respective output signal of the plurality of storage units.

In accordance with another exemplary embodiment of the present invention, operation method of a semiconductor memory device includes inputting first information data in a first mode register unit and storing the first information data, and inputting second information data in a second mode register unit before the storing of the first information data is completed.

The semiconductor memory device in accordance with the embodiment of the present invention includes storage units having a short storage completion time. The embodiment of the present invention stores sequentially input information data in a corresponding storage unit based on selection signals that are sequentially activated, thereby enabling a data storage operation of mode register units regardless of the data storage completion time of the mode register units.

According to the embodiment of the present invention, it is possible to sequentially store input data regardless of the data storage completion time of the mode registers. Therefore, a high speed operation of the semiconductor memory device may be obtained.

BRIEF DESCRIPTION OF THE DRAWINGS

FIG. 6 is an operation waveform diagram for illustrating the operation of a semiconductor memory device of FIG. 3 to FIG. 5.

DETAILED DESCRIPTION

Figure 1:
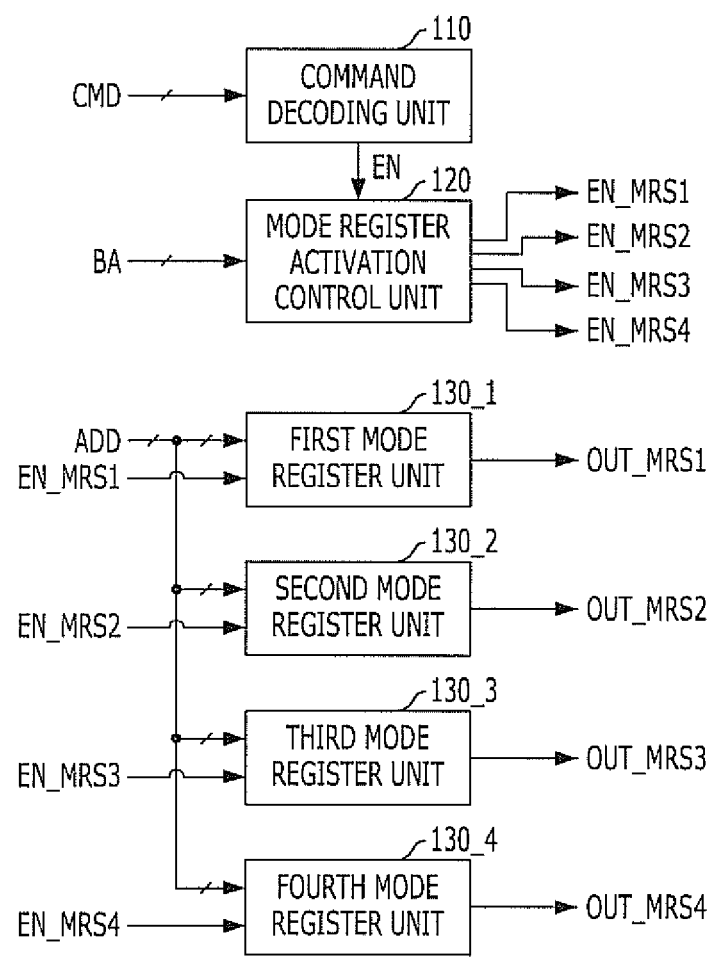
FIG. 1 is a block diagram for illustrating a partial configuration of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
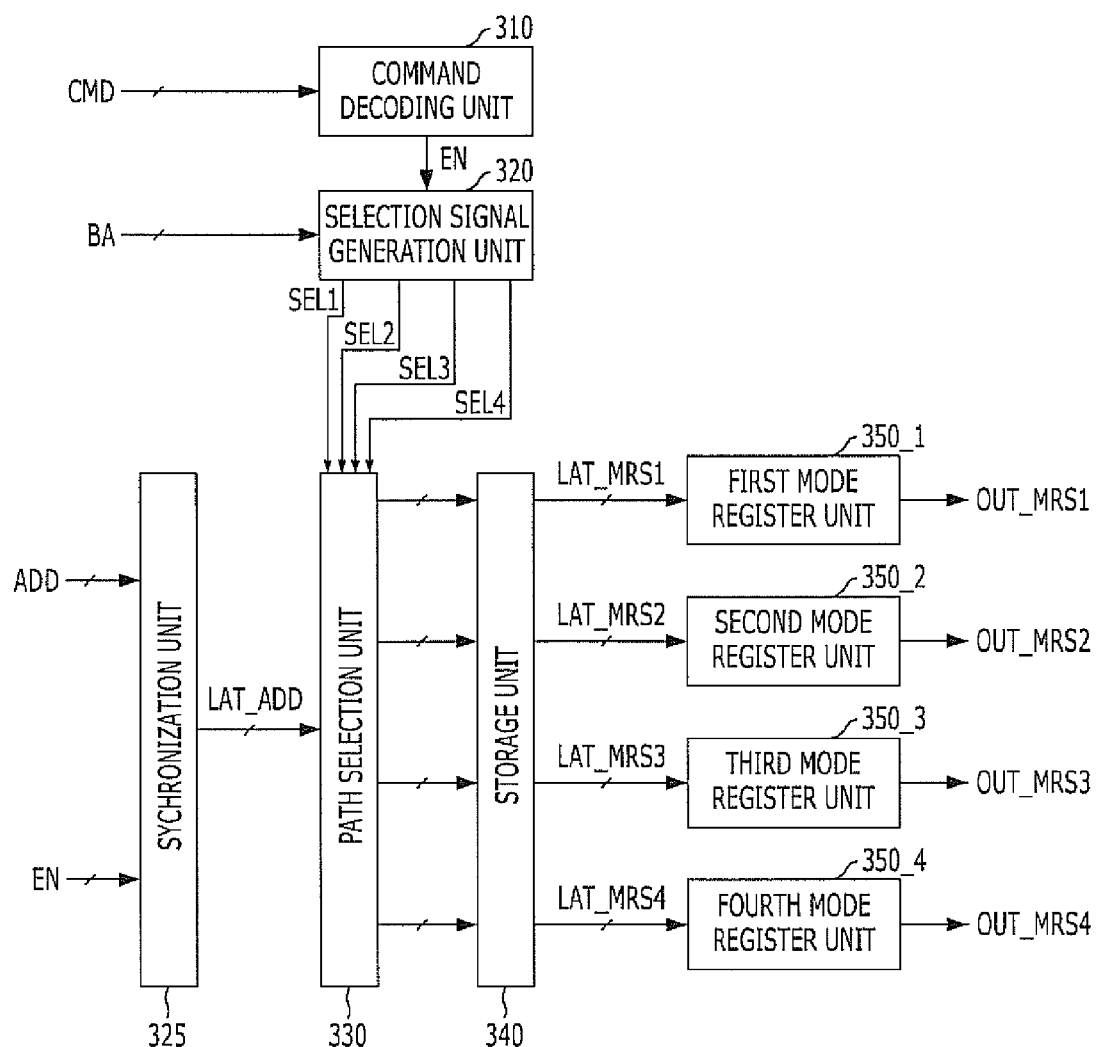
FIG. 3 is a block diagram for illustrating a partial configuration of a semiconductor memory device in accordance with an embodiment of the present invention.

FIG. 3 is a block diagram for illustrating a partial configuration of a semiconductor memory device in accordance with an embodiment of the present invention.

Referring to FIG. 3, the semiconductor memory device includes a command decoding unit 310, a selection signal generation unit 320, a synchronization unit 325, a path selection unit 330, a storage unit 340, and first to fourth mode register units 350_1 to 350_4.

The command decoding unit 310 is configured to generate a mode register enable signal EN in response to a command signal CMD. The command signal CMD, for example, may include a RAS signal (not illustrated), a CAS signal (not illustrated), a write enable signal (WE) (not illustrated), and a chip select signal (CS) (not illustrated), which are external command signals. The command decoding unit 310 is configured to generate an internal read pulse signal, a write/read pulse signal, and the like, as well as the mode register enable signal EN in response to the external command signals.

The selection signal generation unit 320 is configured to generate first to fourth path selection signals SEL1 to SEL4 corresponding to a plurality of bank address signals BA in response to the mode register enable signal EN. The bank address signals BA are sequentially applied, and the first to fourth path selection signals SEL1 to SEL4, which corresponds to the bank address signals BA, are also sequentially activated.

The synchronization unit 325 is configured to synchronize address signals ADD with the mode register enable signal EN and transfer synchronized address signals LAT_ADD to the path selection unit 330. In another exemplary embodiment, the synchronization unit 325 may be omitted. The path selection unit 330 is configured to select transmission paths of the synchronized address signals LAT_ADD, which are sequentially input from the synchronization unit 325, in response to the plurality of path selection signals SEL1 to SEL4. The storage unit 340 is configured to store address signals that are output through the paths selected by the path selection unit 330.

Figure 4:
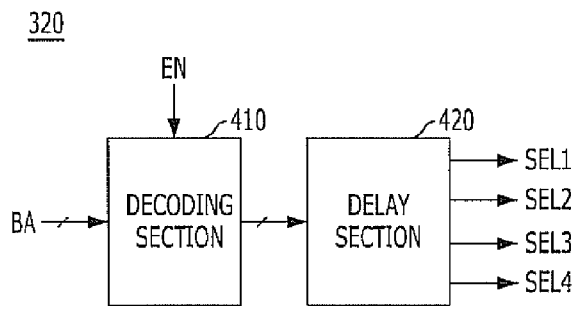
FIG. 4 is a block diagram for illustrating a selection signal generation unit of FIG. 3.

FIG. 4 is a block diagram for illustrating the selection signal generation unit 320 of FIG. 3.

Referring to FIG. 4, the selection signal generation unit 320 includes a decoding section 410 and a delay section 420. The decoding section 410 is configured to decode the bank address signals BA in response to the mode register enable signal EN. The delay section 420 is configured to delay an output signal of the decoding section 410 by a predetermined time and generate the plurality of path selection signals SEL1 to SEL4. A delay time reflected in the delay section 420 is shorter than a time interval at which the address signals ADD are sequentially input.

Figure 5:
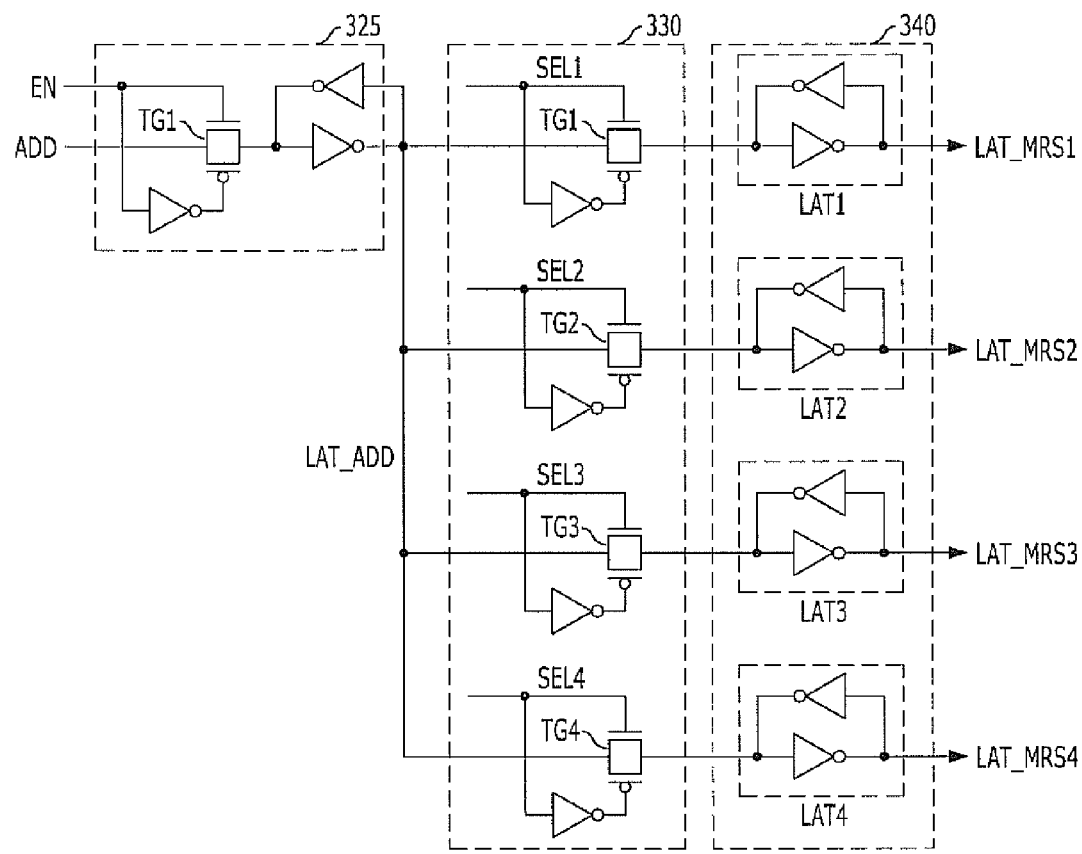
FIG. 5 is a circuit diagram for illustrating a synchronization unit, a path selection unit and a storage unit of FIG. 3.

FIG. 5 is a circuit diagram for illustrating the synchronization unit 325, the path selection unit 330 and the storage unit 340 of FIG. 3.

In FIG. 5, the synchronization unit 325 is configured to synchronize the address signals ADD in response to the mode register enable signal EN and transfer the synchronized address signals LAT_ADD to the path selection unit 330.

The path selection unit 330 selects a transmission path of the synchronized address signals LAT_ADD in response to the plurality of path selection signals SEL1 to SEL4, and includes first to fourth transfer gates TG1 to TG4 that transfer the synchronized address signals LAT_ADD in response to the first to fourth path selection signals SEL1 to SEL4.

The storage unit 340 includes first to fourth storage sections LAT1 to LAT4. Each of first to fourth storage sections LAT1 to LAT4 stores a respective output signal of the first to fourth transfer gates TG1 to TG4, and output first to fourth storage signals LAT_MRS1 to LAT_MRS4, respectively.

Accordingly, the path selection unit 330 transfers the synchronized address signals LAT_ADD to one of the corresponding first to fourth storage sections LAT1 to LAT4, which is provided in the storage unit 340, through transmission paths formed based on the first to fourth path selection signals SEL1 to SEL4.

Referring to FIG. 3, the first to fourth mode register units 350_1 to 350_4 store the first to fourth storage signals LAT_MRS1 to LAT_MRS4, which are output from the first to fourth storage sections LAT1 to LAT4 provided in the storage unit 340. The data stored in the first to fourth mode register units 350_1 to 350_4 may be used as information on CAS latency, a bust type, a burst length, a bank grouping mode, DLL on/off, and the like.

The semiconductor memory device in accordance with the exemplary embodiment of the present invention illustrates the path selection unit 330 that includes four transfer gates, that is, the four transmission paths based on the four mode register units, and the storage unit 340 includes four storage sections. However, greater than four or less than four transfer gates may be used in other exemplary embodiments of the present invention.

FIG. 6 is an operation waveform diagram for illustrating the operation of the semiconductor memory device of FIG. 3 to FIG. 5. Hereinafter, the operation of the semiconductor memory device will be described with reference to FIG. 3 to FIG. 5.

First, the command decoding unit 310 decodes the command signals CMD and activates the mode register enable signal EN. The decoding section 410 of the selection signal generation unit 320 decodes the bank address signals BA, and the delay section 420 delays the decoded signals by a predetermined time and outputs the first to fourth path selection signals SEL1 to SEL4.

The first to fourth path selection signals SEL1 to SEL4 are delayed by a time shorter than the time interval at which the address signals ADD are sequentially input, and are delayed enough to synchronize the synchronized address signals LAT_ADD of the synchronization unit 325. The semiconductor memory device in accordance with the embodiment of the present invention employs an example in which the command signals CMD is delayed to generate the first to fourth path selection signals SEL1 to SEL4. However, in another exemplary embodiment of the present invention, it is also possible to generate the first to fourth path selection signals SEL1 to SEL4 by using all signals having information on input time points of the address signals ADD.

Meanwhile, the synchronization unit 325 synchronizes the address signals ADD in response to the mode register enable signal EN, and the synchronized address signals LAT_ADD are output and transferred through the first to fourth transfer gates TG1 to TG4 corresponding to the first to fourth path selection signals SEL1 to SEL4. That is, the synchronized address signals LAT_ADD are transferred through a transmission path corresponding to an activated selection signal of the first to fourth path selection signals SEL1 to SEL4. The transferred signals are stored in the first to fourth storage sections LAT1 to LAT4 provided in the storage unit 340 and are output as the first to fourth storage signals LAT_MRS1 to LAT_MRS4. The first to fourth storage signals LAT_MRS1 to LAT_MRS4 are stored in the first to fourth mode register units 350_1 to 350_4, and are decoded to be output as first to fourth mode register output signals OUT_MRS1 to OUT_MRS4, respectively.

The semiconductor memory device in accordance with the embodiment of the present invention includes the first to fourth storage sections LAT1 to LAT4 of the storage unit 340 and the first to fourth mode register units 350_1 to 350_4. The storage unit 340 takes certain data as input, and the first to fourth mode register units 350_1 to 350_4 also take certain data as input. Data storage completion time (hereinafter, referred to as a "first storage completion time") in the first to fourth storage sections LAT1 to LAT4 of the storage unit 340 is different from a data storage completion time (hereinafter, referred to as a "second storage completion time") in the first to fourth mode register units 350_1 to 350_4. In FIG. 6, the first storage completion time is indicated by "T1", the second storage completion time is indicated by "T2". The second storage completion time T2 is longer than the first storage completion time T1.

Here, "T1" represents the first storage completion time that the synchronized address signals LAT_ADD of the synchronization unit 325 have been directly input to and completely stored in the storage unit 340 at the time point when the first to fourth path selection signals SEL1 to SEL4 are activated. "T2" represents the second storage completion time that the first to fourth storage signals LAT_MRS1 to LAT_MRS4 have been completely stored in the first to fourth mode register units 350_1 to 350_4 after a predetermined time corresponding to "T2".

Figure 2:
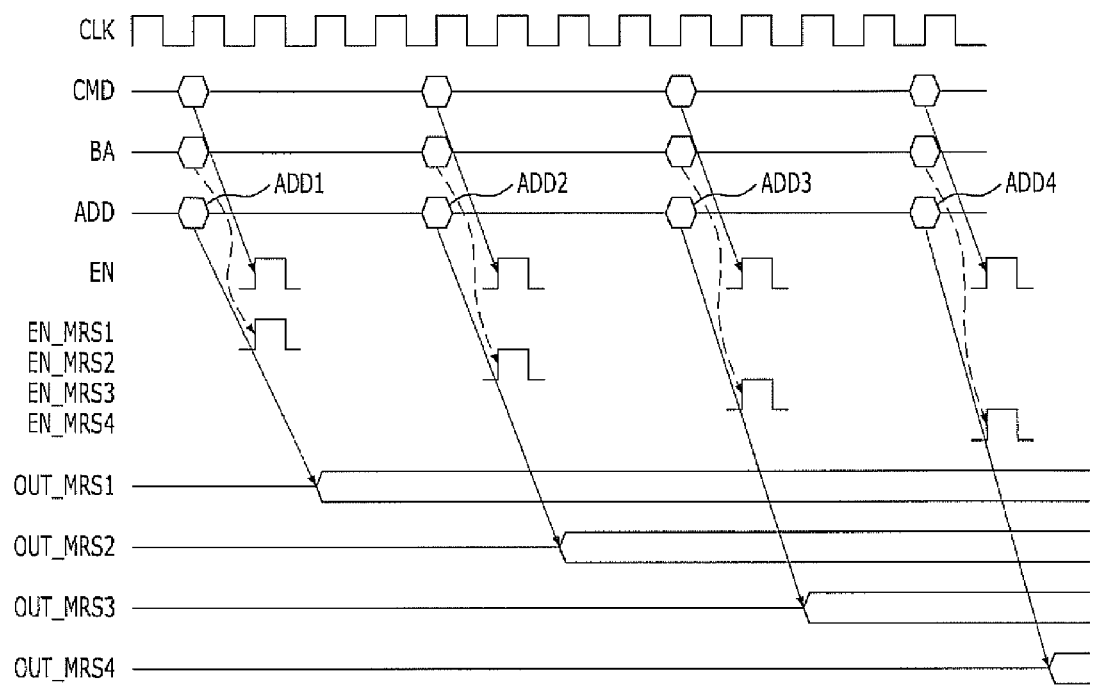
FIG. 2 is an operation waveform diagram for illustrating the operation of a semiconductor memory device of FIG. 1.

In a conventional operation, as apparent from FIG. 2, the command signals CMD for setting the mode register units is input at an interval of five clocks based on a clock signal CLK. This represents that the semiconductor memory device operates with a sufficient margin in consideration of the long second storage completion time of the mode register units. However, in the embodiment of the present invention, the command signals CMD for setting the mode register units may be input at an interval of one clock based on a clock signal CLK. This is because only the first storage completion time of the storage unit 340 is considered regardless of the second storage completion time of the mode register units. That is, after a first address signal ADD1 and a command signal CMD corresponding to the first address signal ADD1 is input, a second address signal ADD2 and a command signal CMD corresponding to the second address signal ADD2 may be input. This applies to a third address signal ADD3 and a fourth address signal ADD4 in the same manner.

As described above, the semiconductor memory device in accordance with the embodiment of the present invention includes the storage unit 340 having the short storage completion time and stores the address signals ADD, which are sequentially input based on the sequentially activated first to fourth path selection signals SEL1 to SEL4, in a corresponding storage unit. This may allow enabling of a data storage operation of the mode register units at a higher speed, regardless of the data storage completion time of the first to fourth mode register units 350_1 to 350_4.

While the present invention has been described with respect to the specific embodiments, it will be apparent to those skilled in the art that various changes and modifications may be made without departing from the spirit and scope of the invention as defined in the following claims.

What is claimed is:

1. An operation method of a semiconductor memory device, comprising:
   generating a plurality of output selection signals based on a mode register activation signal and information data inputted into the semiconductor device at an interval of one clock cycle based on a clock signal;
   activating a plurality of selection paths corresponding to the output selection signals;
   storing the output selection signals within a first storage completion time, in a plurality of storage units that correspond to the activated selection paths; and
   storing output signals of the plurality of storage units within a second storage completion time which is longer than the first storage completion time, in a corresponding plurality of mode registers.

2. The operation method of claim 1, wherein the information data is input at a time interval corresponding to the first storage completion time.

3. An operation method of a semiconductor memory device, comprising:

generating a plurality of sequentially activated selection signals from a mode register activation signal and at least one bank address inputted into the semiconductor device at an interval of one clock cycle based on a clock signal, wherein the plurality of sequentially activated selection signals are delayed by a predetermined time before activating corresponding selection paths;

sequentially inputting information data into the semiconductor device, wherein the predetermined time delay is shorter than a time interval in which the information data is input;

storing the information data in a plurality of storage units corresponding to the activated selection paths within a first storage completion time; and storing an output signal of the plurality of storage units in a corresponding plurality of mode registers during a second storage completion time which is longer than the first storage completion time.

4. The operation method of claim 3, wherein the selection signals include an input time point of the at least one bank address.

5. The operation method of claim 4, further comprising:
synchronizing the at least one bank address signal based on the mode register activation signal and the input time point.

6. An operation method of a semiconductor memory device, comprising:

generating a mode register activation signal from an external command inputted into the semiconductor device at an interval of one clock cycle based on a clock signal;

generating a plurality of selection signals based on the generated mode register activation signal and information data inputted into the semiconductor device;

activating the selection paths corresponding to the selection signals;

storing the selection signals in a plurality of storage units each corresponding to the activated selection paths within a first storage time; and storing output signals of the storage units in a plurality of corresponding mode registers after activation of the selection path and after the first storage time has completed.

7. The operation method of claim 6, further comprising:
synchronizing address signals input into the semiconductor device based on the mode register activation signal; and storing the synchronized address signals in the storage units corresponding to the activated selection paths within the first storage time.

8. The operation method of claim 7, wherein synchronizing address signals includes:
delaying the selection signals by a time shorter than the time interval at which the address signals are sequentially input so that the selection signals are synchronized with the address signals.

* * * * *